(12) United States Patent
Cassagnes et al.

(10) Patent No.: US 6,741,194 B1
(45) Date of Patent: May 25, 2004

(54) METHODS AND APPARATUS FOR DETECTING OUT-OF-RANGE SIGNALS IN AN ANALOG-TO-DIGITAL CONVERTER

(75) Inventors: Thierry Cassagnes, Plaisance du Touch (FR); Douglas A. Garrity, Gilbert, AZ (US); Ira G. Miller, Tempe, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/328,360

(22) Filed: Dec. 23, 2002

(51) Int. Cl.$^7$ ................................................ H03M 1/06
(52) U.S. Cl. ...................... 341/118; 341/139; 341/155; 341/158; 341/161
(58) Field of Search ................... 341/118, 132, 341/139, 155, 153, 161, 162

(56) References Cited

U.S. PATENT DOCUMENTS

| | | | | |
|---|---|---|---|---|
| 4,827,191 A | * | 5/1989 | Chapman | 341/132 |
| 4,851,842 A | * | 7/1989 | Iwamatsu | 341/139 |
| 4,908,621 A | * | 3/1990 | Polonio et al. | 341/120 |
| 5,043,732 A | * | 8/1991 | Robertson et al. | 341/156 |
| 5,525,920 A | | 6/1996 | Rakers et al. | |
| 5,574,457 A | | 11/1996 | Garrity et al. | |
| 5,644,313 A | * | 7/1997 | Rakers et al. | 341/163 |
| 5,825,319 A | * | 10/1998 | Murden et al. | 341/132 |
| 5,894,284 A | | 4/1999 | Garrity et al. | |
| 5,929,799 A | * | 7/1999 | Rothenberg | 341/156 |
| 6,087,969 A | | 7/2000 | Stockstad et al. | |
| 6,362,770 B1 | | 3/2002 | Miller et al. | |
| 6,407,689 B1 | * | 6/2002 | Bazarjani et al. | 341/143 |

OTHER PUBLICATIONS

Lewis, S. H. et al., "A 10–b 20–Msample/s Analog–to–Digital Converter", IEEE Journal of Solid–State Circuits, vol. 27, No. 3, Mar. 1992, pp. 351–358.*

* cited by examiner

Primary Examiner—Michael Tokar
Assistant Examiner—Khai M. Nguyen
(74) Attorney, Agent, or Firm—Ingrassia Fisher & Lorenz, P.C.

(57) ABSTRACT

An analog-to-digital (A/D) converter suitable for use with redundant signed digit (RSD) coverter stages is provided with an out-of-range (OOR) detection circuit. If an out-of-range input signal is detected, the detection circuit identifies the OOR condition so that the converter can take remedial action. Examples of remedial action may include adjusting the gain of one or more converter stages, adjusting the analog input signal provided to one or more converter stages, and/or adjusting the digital output of the converter to reflect the OOR condition. The ORR detection circuit may receive its input from a converter stage that is distinct from the stage providing the most significant bit (MSB) of the digital output to preserve the resolution of the most significant bit.

31 Claims, 2 Drawing Sheets

US 6,741,194 B1

1

METHODS AND APPARATUS FOR DETECTING OUT-OF-RANGE SIGNALS IN AN ANALOG-TO-DIGITAL CONVERTER

FIELD OF THE INVENTION

The present invention generally relates to analog-to-digital converters, and more particularly relates to detecting out-of-range input signals in analog-to-digital converters.

BACKGROUND OF THE INVENTION

Analog-to-digital (A/D) converters translate analog signals (such as radio frequency (RF) signals, electrical signals and the like) to digital equivalents that can be stored and/or manipulated by conventional processing components such as memories, microprocessors, digital signal processors, digital logic gates and the like. A/D converters are commonly used in many devices such as wireless phones, RF transmitters/receivers, audio/video components and countless other electronic devices.

One type of commonly-used A/D converter is the redundant signed digit (RSD) converter which uses a "pipeline" of converter stages to extract the various digital bits from an input analog signal. Each RSD stage typically compares the analog signal received at an input with a reference voltage to determine an appropriate digital output (e.g. one or more logical "0" or "1" signals). Depending on the results of the comparison, the analog output is adjusted and/or amplified as appropriate and provided as an input to one or more subsequent stages, which then continue to process the analog signal until the conversion is complete. After the analog signal propagates through the RSD stages, the various digital outputs can be collected and provided as a digital output of the A/D converter. An example of an RSD converter is described in U.S. Pat. No. 5,644,313.

Although RSD converters are generally effective at converting analog signals to digital equivalents, problems can arise if the converter receives an analog input that is beyond the input range of the converter. If the analog input has a magnitude that exceeds the limits of the converter, the excessive portion may become amplified as the signal propagates through the RSD stages until the one or more stages becomes saturated with an overly large analog input. If one or more stages becomes saturated, the speed of the converter can be dramatically reduced as the saturated stage(s) take time to recover. Moreover, the accuracy of the digital output produced by an out-of-range signal may be compromised until the saturated RSD stage(s) are able to recover.

Accordingly, it is desirable to create an A/D converter that is capable of detecting out-of-range input signals in order to avoid saturating of any of the converter stages. In addition, it is desirable to create an A/D converter that provides a reliable digital output even when the input analog signal is out of range. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

2

Figure 2:
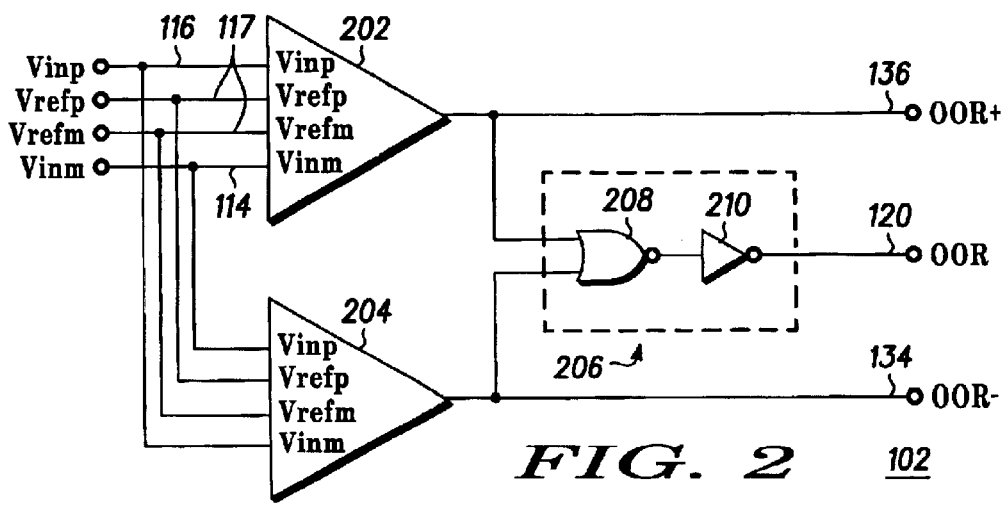
Figure 3:
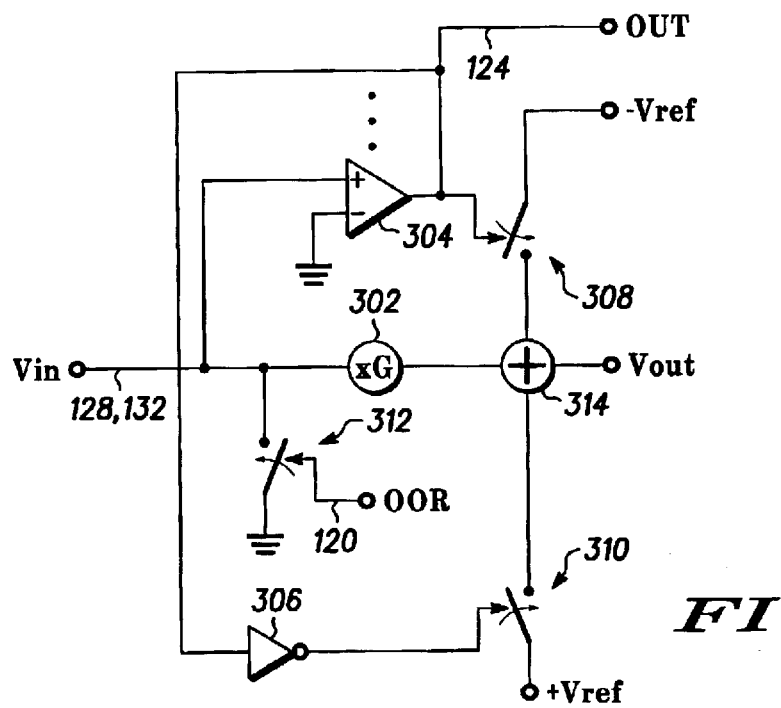
Figure 4:
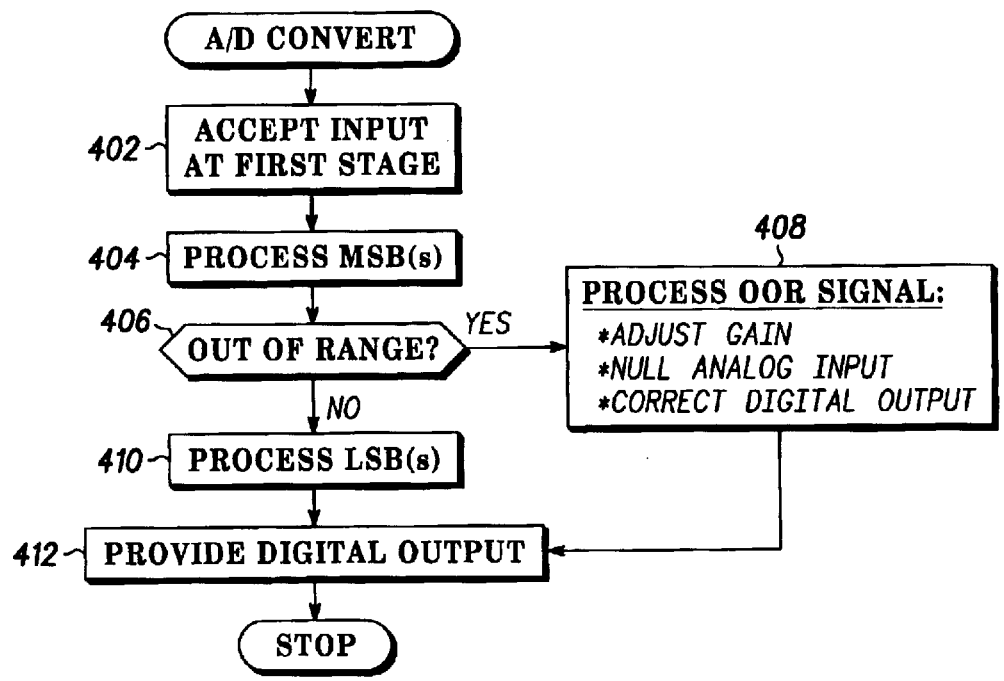

FIG. 2 is a circuit diagram of an exemplary out-of-range signal detection circuit;

FIG. 3 is a block diagram of an exemplary conversion stage for an analog-to-digital controller; and FIG. 4 is a flowchart of an exemplary process for converting an analog signal to an equivalent digital signal.

DETAILED DESCRIPTION OF THE DRAWINGS

The following detailed description of the invention is merely exemplary in nature and is not intended to limit the invention or the application and uses of the invention. Furthermore, there is no intention to be bound by any theory presented in the preceding background of the invention or the following detailed description of the drawings.

According to various embodiments, an analog-to-digital (A/D) converter is provided with an out-of-range (OOR) detection circuit that identifies analog inputs that are outside the range of the converter by comparing the analog signal to a reference signal. If an out-of-range signal is detected, the detection circuit provides an OOR indication so that the converter can take remedial action. Examples of remedial action include adjusting the gain of one or more RSD stages, adjusting the analog input signal that is provided to one or more stages, and/or adjusting the digital output of the converter to reflect the out of range condition. In a further embodiment, the out-of-range signal detector is placed in parallel with an RSD stage that is distinct from the stage providing the most significant bit (MSB) of the digital output to preserve the resolution of the converter. By detecting out-of-range analog input signals and compensating for these signals before they are able to propagate through the RSD stage pipeline, saturation can be avoided while preserving the digital output of the converter.

Figure 1:
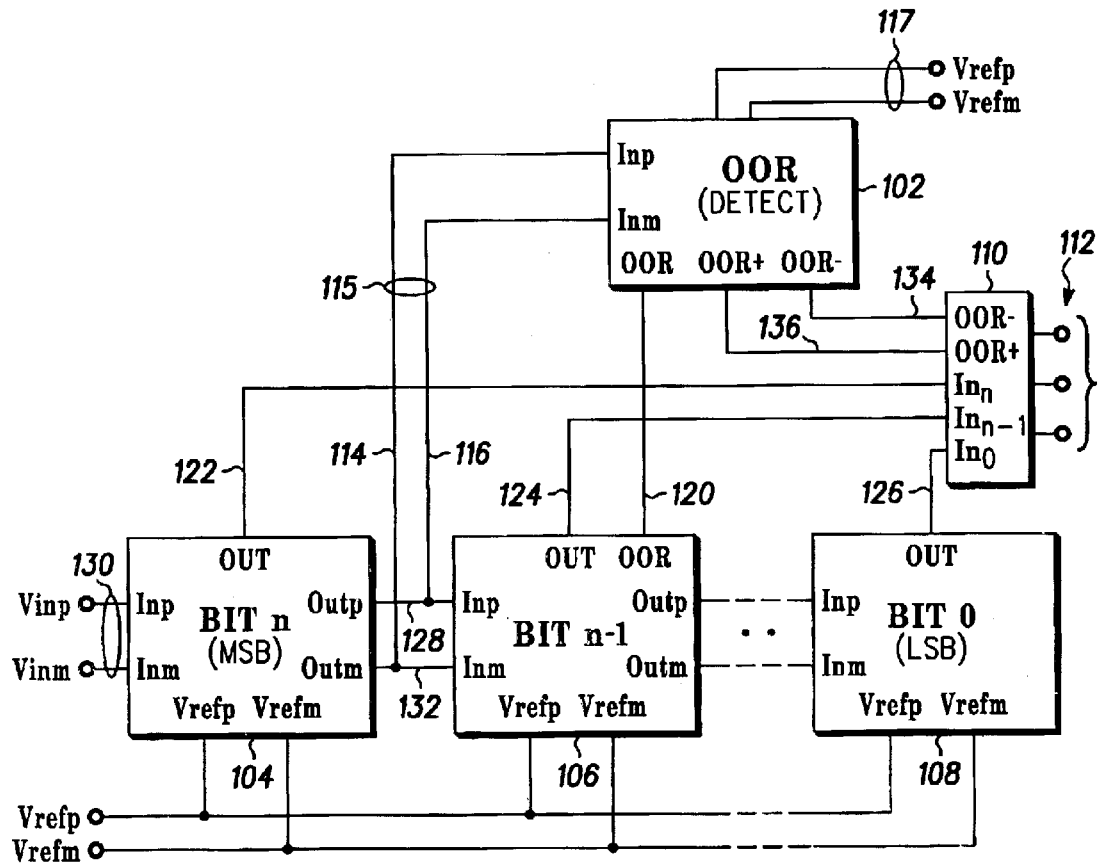
FIG. 1 is a block diagram of an exemplary analog-to-digital converter having out-of-range signal detection.

With reference now to FIG. 1, an exemplary analog-to-digital (A/D) converter 100 suitably includes one or more conversion stages 104, 106, 108; an out-of-range (OOR) detector 102; and an optional recombination circuit 112. A/D converter 100 receives an analog input signal 130 from an external circuit or other source, and produces an equivalent digital representation 112 of signal 130 as an output. In various embodiments, digital bits are extracted by conversion stages 104, 106, 108 and aggregated as an output 112 from recombination circuit 110. When an analog input signal 130 has a magnitude that is outside of the detecting range of converter 100, this condition is identified by detector circuit 102 and processed accordingly.

Conversion stages 104, 106, 108 are any circuits or modules capable of extracting one or more digital bits from an analog input. In various embodiments, conversion stages 104, 106, 108 are redundant signed digit (RSD) stages, each with an analog input, an analog output and a digital output. Each stage 104, 106, 108 suitably compares the voltage of the analog signal received at the input to a reference signal, and provides a corresponding digital output to indicate the magnitude of the input voltage with respect to the reference voltage. In various embodiments, the reference voltage defines a range of operation for the conversion stage 104, 106, 108. The reference signal may define an upper or lower bound on the detector range, for example, or a midpoint or any other point of reference. Either or both of the input signal and the reference signal may be provided to conversion stages 104, 106, 108 as differential or single-ended voltages, or as any other electrical signals. In an exemplary embodiment, conversion stages 104, 106, 108 each receive an analog input (e.g. $V_{inp}$, $V_{inm}$) and a reference signal ($V_{refp}$, $V_{refm}$) as differential voltages. Each of these signals are provided to a comparator (as discussed below in conjunction with FIG. 3) that returns a logic "1" if the magnitude of the input signal is in the upper portion of the detector range, and a logic "0" if the magnitude of the input signal is in the lower portion of the detector range, as appropriate. Alternatively, each of the stages 104, 106, 108 may produce a digital output having two or more bits corresponding to increased resolution of the stage. For example, the various stages 104, 106, 108 may return a two-bit "10" result if the input voltage is in the upper third of the sensitivity range, a "01" result if the input voltage is in the middle third, and a "00" result if the input voltage is in the lowest third of the sensitivity range. In such embodiments, the two-digit output is provided to recombination circuit 112 where the outputs from successive stages are added to produce digital outputs 112 from A/D converter 100. The digital output signals 122, 124, 126 from each stage are provided to recombination circuit 110 where they are combined, aligned, synchronized and/or otherwise provided as outputs 112 from A/D converter 100 using latch circuitry or other appropriate digital output techniques. Of course other equivalent embodiments could be formulated to include any analog to digital conversion and/or output scheme.

In addition to providing a digital output 122, 124, 126, some or all of converter stages 104, 106, 108 may provide an appropriate analog output (e.g. $V_{outp}$, $V_{outm}$) to a subsequent or "less significant" stage for further processing. As used herein, the terms "more significant" or "less significant" refer to conversion stages that are closer or further away (respectively) in the processing chain from the analog input 130 provided to A/D converter 100. In the exemplary embodiment shown in FIG. 1, for example, processing stage 104 receives analog input signal 130 and therefore provides the "most significant bit" (MSB) of the three-bit digital output 112 from A/D converter 100. Similarly, processing stage 108 is shown furthest from input 130 in FIG. 1, and therefore provides the "least significant bit" (LSB) of the digital output.

The various processing stages 104, 106, and 108 may be arranged in any configuration to produce a digital output of an appropriate resolution. While FIG. 1 shows processing stages 104, 106 and 108 configured in a pipeline arrangement with the outputs of a more significant bit coupled to the inputs of a less significant bit, equivalent embodiments include cyclic A/D converters whereby the output of one or more converter stages is provided in a feedback loop as an input to a more-significant bit converter. In such embodiments, the various conversion stages are implemented using only relatively small number of hardware modules (e.g. one or two modules) configured in an iterative fashion as described above. For this reason, the term "stage" as used herein is intended to broadly encompass any hardware, software or logical component that produces one or more digital bits in response to an analog input. Further, any number of converter stages 104, 106, 108 may be used in the various embodiments. While FIG. 1 shows a three-bit A/D converter, alternate embodiments may include pipeline or cyclic arrangements producing any number of bits or any level of resolution, including two, four, eight, ten, sixteen or any other number of bits.

The analog outputs of each stage are generated and provided to subsequent stages according to any scheme or technique. In one embodiment, a differential analog output 128, 132 is produced by one or more stages 104 as a function of the analog signal 132 that is input to the stage. The analog input signal 132 may be provided to an amplifier or other gain stage, for example, and/or may be scaled by a DC offset voltage as appropriate to maintain the analog signal within the sensitivity range of A/D converter 100. In an exemplary embodiment, the analog input signal is appropriately amplified (e.g. with a gain of about 2, or any other non-unity value) and then scaled as a function of the magnitude of the input voltage. If the input voltage is in the upper range of sensitivity, for example, the amplified signal may be scaled downward by a DC offset corresponding to the reference voltage (or another appropriate value). Similarly, if the input voltage is in the lower range of sensitivity, the amplified signal may be; scaled upward as appropriate. An exemplary scaling scheme is described in additional detail below in conjunction with FIG. 3.

If an analog input signal 132 provided to a conversion stage 104, 106, 108 is outside the detection range for the stage, the amplified signal provided at the output of the stage is typically even further out of range than the input signal. This phenomenon is due to the signal gain produced within the stage, which exacerbates the out-of-range condition as the signal propagates through the conversion stage pipeline until one or more stages becomes saturated. Although a saturated stage may eventually recover without external intervention, the recovery may require several clock cycles during which time the output 112 of A/D converter 100 may be unreliable. Accordingly, it is highly desirable to identify out-of-range input signals 130 before they propagate through the pipeline.

Out-of-range (OOR) detector 102 is appropriately positioned in parallel (i.e. having common analog inputs) with one or more of the conversion stages 104, 106, 108 to identify out-of-range input signals 130 before the signal saturates one or more components of A/D detector 100. OOR detector 102 is any circuit, component or module capable of identifying out-of-range signals. In an exemplary embodiment, OOR detector 102 includes a comparator or other appropriate circuitry as discussed below in conjunction with FIG. 2. The comparator circuitry suitably accepts an analog detect signal 115, compares the signal to a reference signal 117, and provides a corresponding digital output. Reference signal 117 may be provided from any external or internal source, and may be a differential or single-ended voltage, or any other type of electrical indication. In an exemplary embodiment, reference signal 117 is a differential voltage ($V_{refp}$, $V_{refn}$) on the order of about 1 volt, although of course signals of any type or magnitude could alternatively be used.

OOR detector 102 may be electrically positioned in parallel connection to any converter stages 104, 106, and/or 108 as appropriate by electrically connecting detect signal 115 to the analog input(s) of any converter stage 104, 106, 108. Detect signal 115 may correspond to circuit input 130, for example, to detect out-of-range signals as they are input to the most significant bit converter 104. Alternatively, OOR detector 102 may be located in parallel with a converter distinct from the most significant bit to reduce loading on the most significant bit converter (which typically requires the highest sensitivity resolution of the converters in the pipeline), and to allow some amplification of OOR signals such that they become easier to detect. In the embodiment shown in FIG. 1, for example, OOR detector circuit 102 receives a differential detect signal 115 along two conductors 114 and 116 that are connected to the analog outputs 128, 132 of the most significant bit converter 104. This analog signal is also provided as an input to bit converter 106 as shown. In embodiments having additional converter stages 104, 106, 108, analog input 130 may be allowed to propagate through two or more stages before being provided as the detect signal 115 to further amplify the OOR portion of the signal and to reduce loading on the most significant bit stages.

Outputs from OOR detector 102 may include a digital out-of-range signal 120 that identifies the presence or absence of an OOR input signal. Signals corresponding to OOR conditions exceeding an upper bound (signal 136) and/or a lower bound (signal 134) may be additionally or alternatively provided. One or more of the output signals 120, 134, 136 may be provided to recombination circuit 110 and/or to one or more conversion stages 104, 106, 108 to initiate an appropriate response to an OOR condition. For example, signal 120 is shown in FIG. 1 as connecting to conversion stage 106 so that the analog signal gain provided by the stage can be adjusted, or so that the analog signal propagating through the stage can be manipulated as appropriate, and as described more fully below. Upper bound signal 134 and lower bound signal 136 may also be provided to the various converter stages and/or to recombination circuit 110 to manipulate the digital outputs 112 of A/D converter 100 as appropriate. If a signal is identified to exceed the upper bound of the sensitivity range, for example, upper bound signal 136 suitably indicates that the digital output 112 should be a logically high vague (e.g. all "1"s). Similarly, lower bound signal 134 may indicate that an input signal 115 lies outside a lower bound, and therefore the digital output 112 should be a logically low value (e.g. all "0"s). If an upper or lower bound condition is indicated, digital outputs may be manipulated within each conversion stage 104, 106, 108 to provide a desired result on digital outputs. 122, 124, 126 (respectively). Alternatively, digital outputs 122, 124, 126 may be ignored or overridden at recombination circuit 110 when an OOR condition is identified. OOR signals 120, 134 and 136 may also be provided as external outputs from A/D converter 100 in various embodiments. The various digital outputs 112 and the various OOR signals may be processed or manipulated in any manner by an external device such as a wireless phone, RF transmitters/receiver, audio/video component or the like.

With reference now to FIG. 2, an exemplary OOR detect circuit 102 suitably includes a positive-range comparator 202 and a negative-range comparator 204 to identify out-of-range input signals. Each converter 202, 204 suitably receives detect signal 115 (FIG. 1, shown in FIG. 2 as differential signals 114 and 116) and reference signal 117, and provides a digital output 136, 134 indicating if an out-of-range signal is present. In the embodiment shown in FIG. 2, both detect signal 115 and reference signal 117 are provided as differential signals. The polarity of detect signal 115 is shown reversed between comparator 202 and 204 so that signals lying outside of a positive or negative sensitivity range can be identified. In an alternate embodiment, the polarity of reference signal 117 could be reversed to produce a logically equivalent result. Upper bound signal 136 and lower bound signal 134 may be further processed using any digital logic circuitry 206 to produce a combined OOR signal 120 as discussed above. In the embodiment shown in FIG. 2, digital logic circuitry 206 includes a NOR-gate 208 and an inverter 210, although any type of equivalent logic could be used in alternate embodiments. Although not shown in FIG. 2, OOR detect circuit 102 may also include digital or analog circuitry for producing digital outputs 112 (FIG. 1) in the event of an OOR condition. Such circuitry may include an array of serially-connected latches or flip-flops (e.g. D-type flip flops) to propagate signals 134 and/or 136 across a proper number of output bits 112. Further, alternate embodiments may adjust reference signal 117 by an offset to tune the sensitivity of OOR detect circuit 102. A DC offset having a magnitude on the order of one or two times the sensitive range of the least significant bits, for example, could be added to reference signal 117 to compensate for process and part variations, and other factors.

Referring to FIG. 3, an exemplary RSD conversion stage 106 suitably includes a gain stage 302, a comparator 304 and appropriate logic to provide an analog output ($V_{out}$) and a digital output 124 in response to an analog input 128, 132. Although the analog signals $V_{in}$, $V_{out}$ are shown in FIG. 3 as single-ended signals intended to be processed with reference to a reference voltage (e.g. ground), equivalent differential signals could be alternatively or additionally provided. As an analog input signal 128, 132 propagates through conversion stage 106, the signal is appropriately amplified by a gain stage 302, which may be any type of operational amplifier or other amplification device or circuit. Gain stage 302 suitably amplifies the input signal by a sufficient amount to maintain the output signal $V_{out}$ within the sensitivity range of A/D converter 100. In an exemplary embodiment, gain stage 302 has a gain of about two, although other values could be used in alternate embodiments.

Comparator 304 suitably compares the analog input signal 128, 132 to a reference signal (which may be externally provided, or may be a readily-available reference such as ground) to produce digital output 124. Additional comparators 304 may be provided in alternate embodiments to allow for differential input signals and/or increased bit resolution in digital output 124. In the embodiment shown in FIG. 2, digital output 124 is logically high if the input is greater than the reference voltage and logically low if the input is lower than the reference voltage. This digital result 124 is provided to recombination circuit 110 (FIG. 1) for output from A/D converter 100. The result. 124 is also provided as a control input to one or more switching elements 308, 310 to provide an appropriate offset voltage ($+/-V_{ref}$) to summing junction 314. In the event input signal 128, 132 is out-of-range, OOR detect circuit 102 suitably provides OOR signal 120, which can be provided to switching element 312 to override input signals 128, 132 and to place the output $V_{out}$ of the stage into a known state. Switching elements 308, 310 and 312 may be implemented with any convenient switch technology such as a field effect transistor (FET), relay, switching circuit or the like.

With continued reference to FIG. 3, the input to gain stage 302 may be appropriately connected to ground or another known value during OOR conditions to place the output of converter 106 into a known state. In embodiments wherein $V_{in}$ and/or $V_{out}$ is a differential signal, each of the differential signals can be coupled to a common source such that the difference between the differential signals is zero, or another known value. While switch 312 is actuated to place the input to gain stage 302 into a known state, the output $V_{out}$ of the stage is similarly driven to a known state. If the input to gain stage 302 is effectively zero (corresponding to ground or to a zero-difference differential input), for example, the output from gain stage 302 is appropriately nulled as well. In an alternate embodiment, gain stage 302 accepts a digital input such as OOR signal 120 to adjust the gain of the input signal during out-of-range conditions (e.g. to zero gain, or to a gain of less than one to effectively attenuate the analog signal until it is again within range of conversion stage 106). In a further embodiment, variable gain techniques can be combined with nulling circuitry to further place the analog signal $V_{in}$ within range of conversion stage 106, or otherwise into a known state.

With reference now to FIG. 4, an exemplary technique for producing a digital equivalent for an analog signal is shown.

The analog signal is received as an input (step 402) to an analog-to-digital converter such as a multi-stage RSD converter. As the input is received, the converter appropriately processes the analog signal to extract the most significant bits of the digital equivalent (step 404). As described above, the RSD stages that compute the most significant bits typically require the greatest accuracy, so in some embodiments it may be desirable to reduce loading on the most significant bits by placing any out-of-range detection circuitry in parallel to stages other than the most significant bit stages. Accordingly, out-of-range detection (step 406) may take place after the analog input signal has propagated through the first several stages of a pipelined RSD converter. If an out-of-range signal is identified, processing continues (step 408) to take appropriate remedial action for the out-of-range signal. Remedial actions may include adjusting the gain of one or more RSD stages, "nulling" the analog signal in one or more RSD stages, and/or overriding the digital output at the stages or at a recombination circuit to reflect the out-of-range condition. If no out-of-range signal is detected, the less significant bits of the digital equivalent may be determined according to convention techniques, and an appropriate digital output is provided (step 412). In various embodiments, the digital output is provided from a recombination circuit 110 (FIG. 1) that includes latching or other appropriate circuitry to provide the digital output 112 (FIG. 1) in an appropriate electrical format with appropriate timing.

While an exemplary embodiment(s) has been presented in the foregoing detailed description of the invention, it should be appreciated that a vast number of variations and equivalents exist. For example, while certain aspects of the invention have been described herein with reference to a redundant signed digit pipeline analog-to-digital converter, the concepts disclosed herein may be readily adapted to other circuits, devices and techniques that implement out-of-range signal detection. It should be appreciated that the embodiments contained herein are only examples, and are not intended to limit the scope, applicability, or configuration of the invention in any way. Rather, the foregoing detailed description provides convenient road map for implementing exemplary embodiments of the invention. Various changes may be made in the function and arrangement of elements described in any of the exemplary embodiments without departing from the scope of the invention as set forth in the appended claims and their legal equivalents.

What is claimed is:

1. A method of producing a composite digital output from an analog-to-digital converter having a plurality of conversion stages, each of the plurality of conversion stages having an analog input and an analog output, and wherein each of the conversion stages are configured in series with each other, the method comprising the steps of:
   providing the analog output from one of said plurality of conversion stages as an analog detect signal to an out-of-range detection circuit configured in parallel with at least one of the conversion stages;
   comparing the detect signal to a reference signal to determine if the detect signal is out-of-range; and
   modifying the composite digital output if the detect signal is out-of-range.

2. The method of claim 1 wherein the out-of-range detection circuit is configured in parallel with a conversion stage that is distinct from the stage producing the most-significant bit of the composite digital output.

3. The method of claim 1 further comprising the step of adjusting an analog output from at least one of the conversion stages if the detect signal is out-of-range.

4. The method of claim 1 further comprising the step of adjusting a scaling factor between an analog input and an analog output of at last one conversion stage if the detect signal is out-of-range.

5. The method of claim 2 further comprising the step of adjusting an analog output from at least one of the conversion stages if the detect signal is out-of-range.

6. The method of claim 5 further comprising the step of adjusting a scaling factor between an analog input and the analog output of at least one conversion stage if the detect signal is out-of-range.

7. A method of converting an analog input signal into a composite digital output from an analog-to-digital converter having a plurality of conversion stages configured in series with each other, each conversion stage having an analog input, an analog output and a digital output, the method comprising the steps of:
   receiving the analog input signal at a first conversion stage;
   processing the analog input signal in at least one first conversion stage to produce at least a most significant bit of the composite digital output as a function of the analog input;
   providing an analog detect signal from the analog output of the at least one fast conversion stage to an out-of-range detection circuit;
   comparing the detect signal to a reference signal to determine if the detect signal is out-of-range;
   adjusting the analog output of the at least one first conversion stage if the input signal is out-of-range; and
   modifying the composite digital output if the detect signal is out-of-range.

8. The method of claim 7 further comprising the step of adjusting a scaling factor between the analog input and the analog output of at least one conversion stage if the detect signal is out-of-range.

9. The method of claim 7 further comprising the step of processing the analog output of the at least one first conversion stage to produce at least a least significant bit of the composite digital output if the detect signal is not out of range.

10. The method of claim 9 further comprising the step of aggregating the digital outputs of each of the conversion stages to produce the composite digital output if the detect signal is not out of range.

11. An analog-to-digital converter comprising a plurality of conversion stages configured in series with each other and an out-of-range detection circuit, wherein the out-of-range detection circuit comprises:
   means for receiving a detect signal from at least one of the conversion stages;
   means for comparing the detect signal to a reference signal to determine if the detect signal is out of range; and
   means for producing an out-of-range signal as a function thereof.

12. The converter of claim 11 wherein the out of range detection circuit is coupled to analog output of the at least one of the conversion stages.

13. The converter of claim 11 further wherein the out-of-range detection circuit is further configured to adjust an analog input to at least one of the conversion stages if the detect signal is out-of-range.

14. The converter of claim 11 wherein the out of range detection circuit is coupled to a digital recombination circuit configured to receive a digital output from each of the plurality of conversion stages, to provide a composite output as a function thereof, and to modify the composite output in response to receiving the out-of-range signal from the out-of-range detection circuit.

15. A circuit for converting an analog signal to a digital equivalent, the circuit comprising:

a plurality of redundant conversion stages, each conversion stage having an analog input, an analog output and a digital output, wherein the plurality of redundant conversion stages are configured in series with each other such that the analog output of a more significant stage becomes the analog input of a less significant stage; and an out-of-range detection circuit comprising at least one comparator configured to receive the analog output of at least one of the conversion stages as a detect signal and to produce an out-of-range signal if the detect signal exceeds a reference signal.

16. The circuit of claim 15 further comprising a recombination circuit coupled to the digital outputs of each of the conversion stages, wherein the recombination circuit is configured to aggregate the digital outputs to provide the digital equivalent.

17. The circuit of claim 16 wherein the recombination circuit is configured to receive the out-of-range signal and to override the digital outputs from the conversion stages in response to the out-of-range signal.

18. The circuit of claim 15 wherein at least one of the conversion stages comprises a switching element configured to receive the out-of-range signal from the detection circuit.

19. The circuit of claim 18 wherein the switching element is further configured to place the analog output of the converter into a known state in response to the out-of-range signal.

20. The circuit of claim 18 wherein the switching element is further configured to adjust a processing gain in response to the out-of-range signal.

21. A device having a circuit for converting an analog signal to a digital equivalent, the circuit comprising:

a plurality of redundant signed digit converters configured in series with each other, each converter having an analog output and a digital output; end an out-of-range detection circuit comprising at least one comparator configured to receive a detect signal from the analog output of at least one of the converters and to produce an out-of-range signal if the detect signal exceeds a reference signal;

wherein at least one of the converters comprises a switching element configured to receive the out-of-range signal from the detection circuit and to place the analog output of the converter into a known state in response to the out-of-range signal.

22. The device of claim 21 further comprising a recombination circuit coupled to the digital outputs of each of the converters, wherein the recombination circuit is configured to aggregate the digital outputs to provide the digital equivalent.

23. The device of claim 22 wherein the recombination circuit is configured to override the digital outputs from the converters in response to the out-of-range signal received from the detection circuit.

24. A method of converting an analog input signal to a digital equivalent in an analog-to-digital converter having a plurality of conversion stages configured in series with each other, the method comprising the steps of:

processing the input signal to determine at least one most significant bit of the digital equivalent and to create a detect signal;

initiating a response if the analog input signal is outside the sensitivity range of the analog-to-digital converter; and processing the detect signal to determine at least one less significant bit of the digital equivalent if the analog input signal is within the range of the analog-to-digital converter, wherein the less significant bit is determined at a different one of the plurality of conversion stages than the at least one most significant bit.

25. The method of claim 24 wherein the response comprises adjusting the gain of at least one processing stage in the analog-to-digital converter.

26. The method of claim 24 wherein the response comprises adjusting the detect signal.

27. The method of claim 24 wherein the response comprises providing a pre-determined value for the digital equivalent.

28. An analog-to-digital converter for converting an analog input to a digital equivalent, the converter comprising:

a plurality of processing stages configured to receive the analog input and to provide an analog output and a digital output, wherein each of the plurality of processing stages are configured in series with each other;

an out-of-range detector configured to receive the analog output from at least one of the plurality of processing stages and to create an out-of-range signal if the analog output lies outside of a sensitivity range; and a recombination circuit configured to receive the digital output from the plurality of processing stages and to provide the digital equivalent as a function thereof.

29. The converter of claim 28 wherein the recombination circuit is operable to override the digital output from the plurality of processing stages in response to the out-of range signal.

30. The converter of claim 28 wherein plurality of processing stages is further configured to adjust a gain of at least one of the plurality of processing stages in response to the out-of-range signal.

31. The converter of claim 28 wherein at least one processing stage is further configured to place the analog output into a known state in response to the out-of-range signal.

* * * * *

UNITED STATES PATENT AND TRADEMARK OFFICE
CERTIFICATE OF CORRECTION

PATENT NO. : 6,741,194 B1
DATED : May 25, 2004
INVENTOR(S) : Cassagnes et al.

It is certified that error appears in the above-identified patent and that said Letters Patent is hereby corrected as shown below:

Title page,
Item [57], ABSTRACT,
Line 10, delete "ORR" and add -- OOR --.

Column 8,
Line 3, delete "last" and add -- least --;
Line 25, delete "fast" and add -- first --; and
Line 59, add -- an -- after "to" and before "analog".

Signed and Sealed this

Twenty-second Day of February, 2005

JON W. DUDAS
*Director of the United States Patent and Trademark Office*